United States Patent
Sahara et al.

(10) Patent No.: US 8,013,413 B2
(45) Date of Patent: Sep. 6, 2011

(54) DISTANCE IMAGE SENSOR

(75) Inventors: Masanori Sahara, Hamamatsu (JP); Mitsutaka Takemura, Hamamatsu (JP); Koei Yamamoto, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 192 days.

(21) Appl. No.: 12/514,898

(22) PCT Filed: Nov. 13, 2007

(86) PCT No.: PCT/JP2007/071992
§ 371 (c)(1),
(2), (4) Date: Jun. 25, 2009

(87) PCT Pub. No.: WO2008/059825
PCT Pub. Date: May 22, 2008

(65) Prior Publication Data
US 2010/0078749 A1 Apr. 1, 2010

(30) Foreign Application Priority Data
Nov. 15, 2006 (JP) ................. 2006-309571

(51) Int. Cl.
*H01L 27/146* (2006.01)
(52) U.S. Cl. ............... 257/443; 257/E31.054
(58) Field of Classification Search .............. 257/443, 257/E31.054, 228, 447, 460, 465
See application file for complete search history.

(56) References Cited

U.S. PATENT DOCUMENTS
4,176,369 A * 11/1979 Nelson et al. ............... 257/228

FOREIGN PATENT DOCUMENTS

| JP | 6-326286 | 11/1994 |
|---|---|---|
| JP | 2001-291853 | 10/2001 |
| JP | 2001-291892 | 10/2001 |
| JP | 2003-86827 | 3/2003 |
| JP | 2004-525351 | 8/2004 |
| JP | 2006-173351 | 6/2006 |
| WO | WO 2005/038923 | 4/2005 |

* cited by examiner

*Primary Examiner* — Matthew W Such
*Assistant Examiner* — Monica D Harrison
(74) *Attorney, Agent, or Firm* — Drinker Biddle & Reath LLP

(57) ABSTRACT

In a range image sensor 8, when a first reverse bias voltage applied between a semiconductor substrate 11 and first semiconductor regions 13 is an H bias, first depleted layers A1 and A1 expanding from the p-n junctions of the first semiconductor regions 13 adjacent to each other expand and link to each other so as to cover a second depleted layer B1 expanding from the p-n junction of a second semiconductor region 14. Accordingly, carriers C generated near the rear surface 11*a* of the semiconductor substrate 11 are reliably captured by the first depleted layers A1. Further, when a second reverse bias voltage applied between the semiconductor substrate 11 and the second semiconductor regions 14 is an H bias, the second depleted layers adjacent to each other expand and link to each other so as to cover the first depleted layer. Accordingly, carriers generated near the rear surface of the semiconductor substrate are reliably captured by the second depleted layers.

4 Claims, 9 Drawing Sheets

DISTANCE IMAGE SENSOR

TECHNICAL FIELD

The present invention relates to a so-called rear surface incident type range image sensor.

BACKGROUND ART

Conventionally, a range image sensor which images an image including range information to a target is known. In this range image sensor, a method for acquiring range information by detecting a time of flight (TOF) since light is irradiated onto a target until reflected light is received, has been mainly adopted. This method includes two typical methods, and in one of the methods, the time of flight is measured and acquired, and in the other method, the time of flight is acquired by measuring a phase difference between light irradiated by using periodically modulated light and reflected light.

As a range image sensor using the latter method, one is known which includes a semiconductor substrate of a first conductive type, a first semiconductor region of a second conductive type which forms p-n junction with the semiconductor substrate, and a second semiconductor region of a second conductive type which is adjacent to the first semiconductor region and forms p-n junction with the semiconductor substrate (for example, refer to Patent Document 1).

In such a range image sensor, by applying different reverse bias voltages respectively between the first and second semiconductor regions adjacent to each other and the semiconductor substrate, the sizes of the depleted layers expanding from the p-n junctions of the first and second semiconductor regions are controlled. Then, light is irradiated from the light source toward a target, and reflected light is received, and accordingly, as shown in FIG. 8, an output signal of this reflected light is detected in a time sharing manner as output signals 53 and 54 from the first and second semiconductor regions. At this time, the output signal 54 from the second semiconductor region corresponds to a phase difference D0 between the brightness 55 of the light source and the brightness 56 of the reflected light, and corresponds to the time of flight. Therefore, by detecting the output signal 54 from the second semiconductor region, the time of flight is detected, and range information of the target is acquired.

Patent Document 1: Japanese Translation of International Application No. 2004-525351

DISCLOSURE OF THE INVENTION

Problem to be Solved by the Invention

However, the above-described range image sensor is of a so-called surface incident type which includes first and second semiconductor regions arranged on the surface side of the semiconductor substrate on which light is made incident, and therefore, it has the following problems. That is, the carrier generation density according to incidence of reflected light becomes higher toward the surface of the semiconductor substrate. Therefore, as shown in FIG. 9, even when the depleted layers A0 of the first semiconductor regions 51 are expanded and an output signal is detected from only the first semiconductor regions 51, many carriers C are captured by the depleted layers B0 of the second semiconductor regions 52 from which detection of an output signal is not intended, and the carriers C are detected from the semiconductor regions 52. As a result, a large amount of noise is included in the output signal from the semiconductor regions 52. In this case, on the surface 57a side of the semiconductor substrate 57 on which the reflected light R is made incident, the semiconductor regions 52 and the depleted layers B0 are formed, so that the substantial aperture ratio becomes small. Therefore, the time of flight cannot be accurately detected.

Therefore, an object of the present invention is to provide a range image sensor which can accurately detect the time of flight since light is irradiated onto a target until reflected light is received.

Means for Solving the Problem

To solve the above-described problem, a range image sensor of the present invention includes a semiconductor substrate of a first conductive type onto which light is made incident from the rear surface; a plurality of first semiconductor regions of a second conductive type which are one-dimensionally or two-dimensionally arranged on the surface side of the semiconductor substrate and form p-n junctions with the semiconductor substrate; and a plurality of second semiconductor regions of a second conductive type which are one-dimensionally or two-dimensionally arranged on the surface side of the semiconductor substrate, are adjacent to the first semiconductor regions, and form p-n junctions with the semiconductor substrate, wherein to the semiconductor substrate and the first semiconductor regions, a first electrode and second electrode for applying a first reverse bias voltage between these are electrically connected, respectively, and to the second semiconductor regions, a third electrode for applying a second reverse bias voltage having a predetermined phase difference with respect to the first reverse bias voltage between the second semiconductor regions and the first electrode electrically connected to the semiconductor substrate is electrically connected, and when the first reverse bias voltage to be applied reaches a predetermined bias voltage value, first depleted layers expanding from the p-n junctions of the first semiconductor regions adjacent to each other via the second semiconductor region are set so as to link to each other, and when the second reverse bias voltage to be applied reaches the predetermined bias voltage value, second depleted layers expanding from the p-n junctions of the second semiconductor regions adjacent to each other via the first semiconductor region are set so as to link to each other.

In this range image sensor, when the first reverse bias voltage to be applied between the semiconductor substrate and the first semiconductor regions reaches a predetermined reverse bias voltage value, the first depleted layers adjacent to each other expand and link to each other so as to cover the second depleted layer. Accordingly, carriers generated near the rear surface of the semiconductor substrate can be reliably captured by the first depleted layers, and noise can be suppressed from being included in the output signal from the second semiconductor regions. On the other hand, when the second reverse bias voltage to be applied between the semiconductor substrate and the second semiconductor regions reaches the predetermined reverse bias voltage value, the second depleted layers adjacent to each other expand and link to each other so as to cover the first depleted layer. Accordingly, carriers generated near the rear surface of the semiconductor substrate can be reliably captured by the second depleted layers, and noise can be suppressed from being included in the output signal from the first semiconductor regions.

In addition, by adopting the rear surface incident type in which the first semiconductor regions and the second semiconductor regions are arranged on the surface side of the semiconductor substrate, when the predetermined reverse bias voltage value is applied between the first semiconductor regions or the second semiconductor regions and the semiconductor substrate, substantially the entire region of the rear surface side of the semiconductor substrate is occupied by the first or second depleted layers linking to each other. Therefore, the substantial aperture ratio can be increased. Therefore, according to the range image sensor of the present invention, the time of flight since light is irradiated onto a target until reflected light is received can be accurately detected.

Further, preferably, the first semiconductor regions and the second semiconductor regions have a same shape and a same area as viewed from the surface of the semiconductor substrate. In this case, for example, the photosensitivity of the first semiconductor regions when the first reverse bias voltage reaches the predetermined bias voltage value and the photosensitivity of the second semiconductor regions when the second reverse bias voltage reaches the predetermined bias voltage value can be reliably matched with each other.

Preferably, the first semiconductor regions and the second semiconductor regions are arranged on the surface side of the semiconductor substrate in a predetermined repetitive pattern so that the second semiconductor region or first semiconductor region is disposed between the first semiconductor regions or second semiconductor regions adjacent to each other. In this case, when the first reverse bias voltage or the second reverse bias voltage reaches the predetermined reverse bias voltage value, the first depleted layers or second depleted layers adjacent to each other can be linked to each other in a preferred manner.

Preferably, an outer edge portion including the first semiconductor regions and the second semiconductor regions disposed on the outer periphery among those arranged on the surface of the semiconductor substrate is shielded from light by the rear surface of the semiconductor substrate. Here, on a further outer side than the first semiconductor regions and the second semiconductor regions disposed on the outer periphery among those arranged, no other semiconductor regions except for the semiconductor substrate exist. Therefore, even depleted layers having small expansions among the depleted layers of these semiconductor regions may capture carriers generated at the outer edge portion of the semiconductor substrate. Therefore, as described above, the outer edge portion including the first semiconductor regions and the second semiconductor regions disposed on the outer periphery among those arranged on the surface of the semiconductor substrate is shielded from light by the rear surface of the semiconductor substrate, and accordingly, generation of the carriers at the outer edge portion of the semiconductor substrate can be restrained, and capturing of such carriers can be suppressed.

EFFECT OF THE INVENTION

According to the present invention, the time of flight since light is irradiated onto a target until reflected light is received can be accurately detected.

DESCRIPTION OF THE REFERENCE NUMERALS AND SYMBOLS

Figure 1:
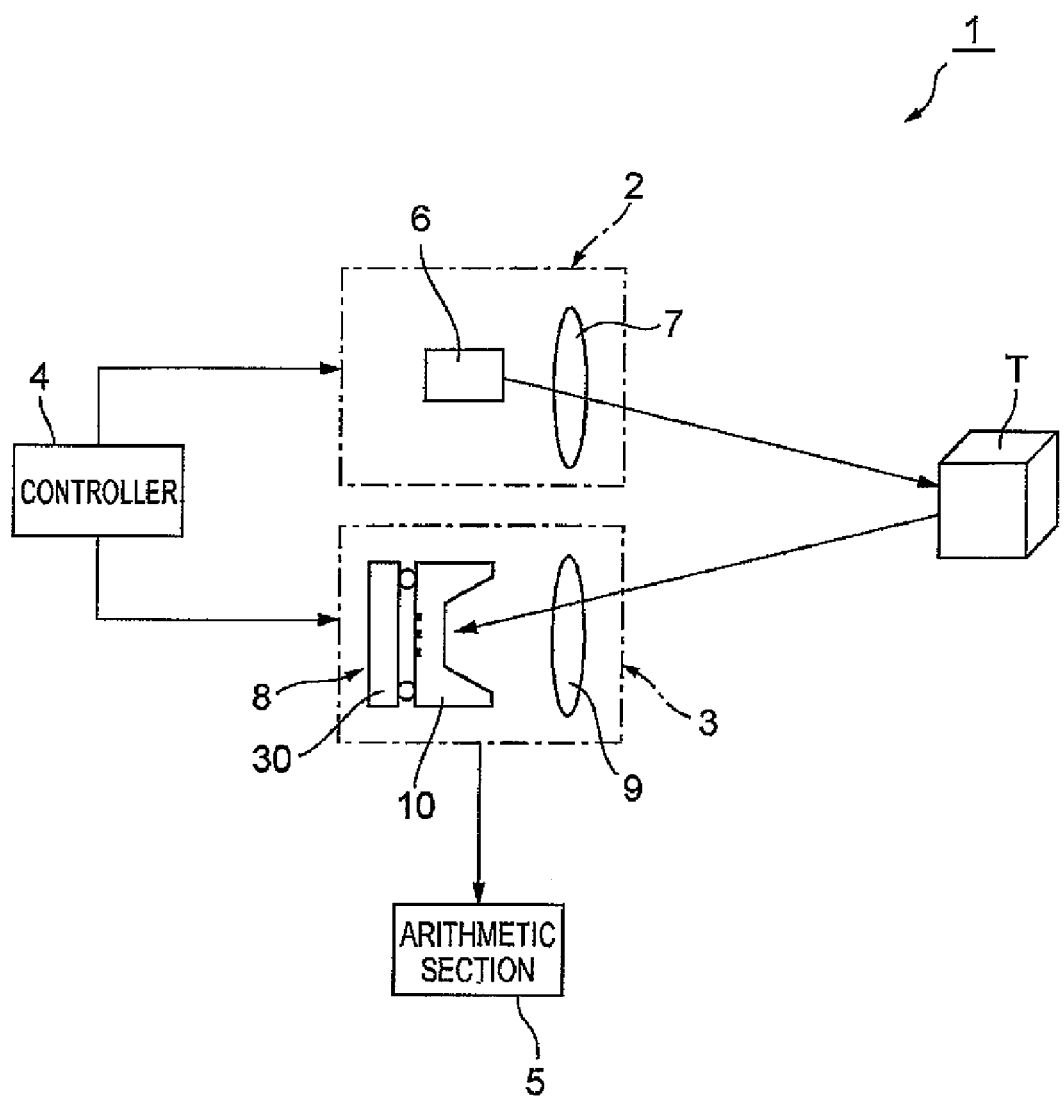
FIG. 1 is a configuration view showing a range image measuring device including a range image sensor of a first embodiment of the present invention.

8: range image sensor, 11: semiconductor substrate, 11a: rear surface, 11b: surface, 13, 51: first semiconductor region, 14, 52: second semiconductor region, 17: second electrode, 18: third electrode, 24: first electrode, A0, A1, A2: first depleted layer, B0, B1, B2: second depleted layer

BEST MODES FOR CARRYING OUT THE INVENTION

Hereinafter, with reference to the drawings, a preferred embodiment of the present invention will be described in detail. In the description of the drawings, elements identical to or equivalent to each other are attached with the same reference numerals, and overlapping description will be omitted.

FIG. 1 is a configuration view showing a range image measuring device including a range image sensor of a first embodiment of the present invention. As shown in FIG. 1, the range image measuring device 1 images an image including range information on the distance to a target or a target region, and is used for, for example, for an in-vehicle camera. The range image measuring device 1 includes a light source 2 which irradiates light onto a target T, an imager 3 which images an image, a controller 4 which controls the light source 2 and the imager 3, and an arithmetic section 5 which generates range image data based on image data.

The light source 2 includes a light emitting element 6 such as a laser diode which emits pulsed light, and a diffusing lens 7 which diffuses light emitted from the light emitting element 6. The light emitting element 6 modulates the brightness of light to be emitted with a predetermined frequency based on an instructed value from the controller 4.

The imager 3 includes a range image sensor 8 and a condensing lens 9 which condenses incident light. The range image sensor 8 is configured by bonding a chip 10 on a ceramic base 30 by bump-bonding. A voltage to be applied to the range image sensor 8 is modulated based on an instructed value from the controller 4.

Figure 2:
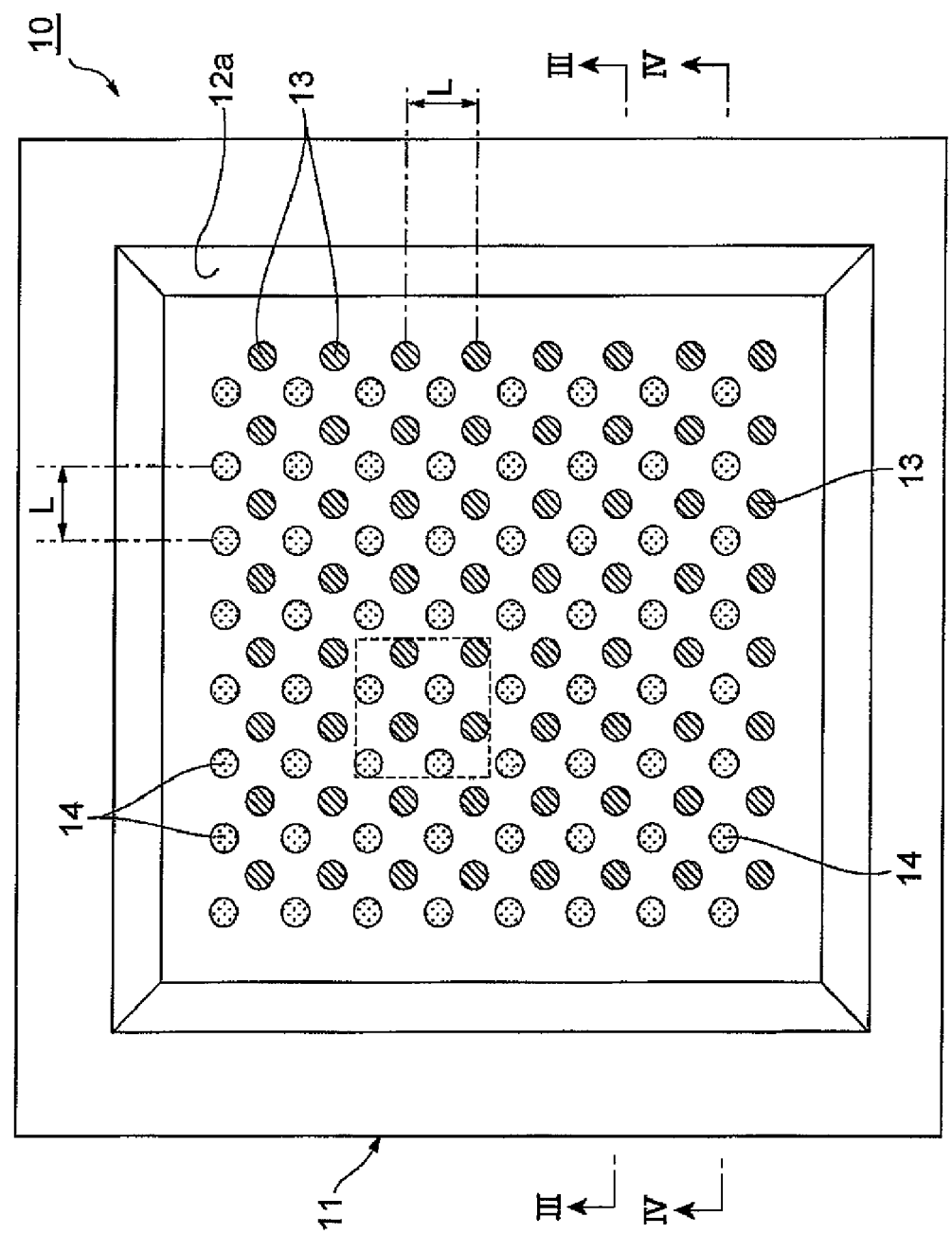
FIG. 2 is a view of the range image sensor of FIG. 1 from the rear surface.
Figure 3:
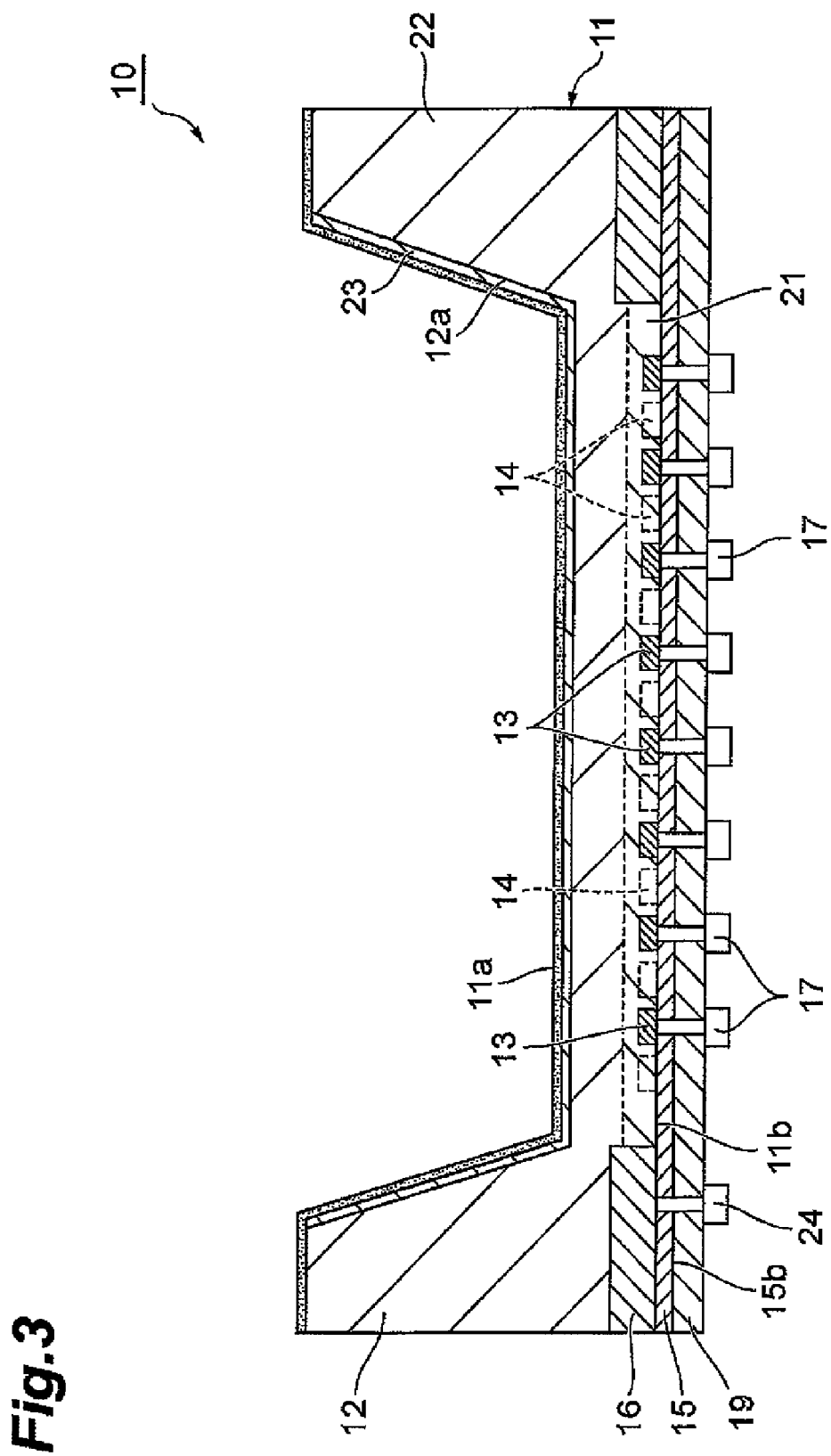
FIG. 3 is an end view along the III-III line of FIG. 2.
Figure 4:
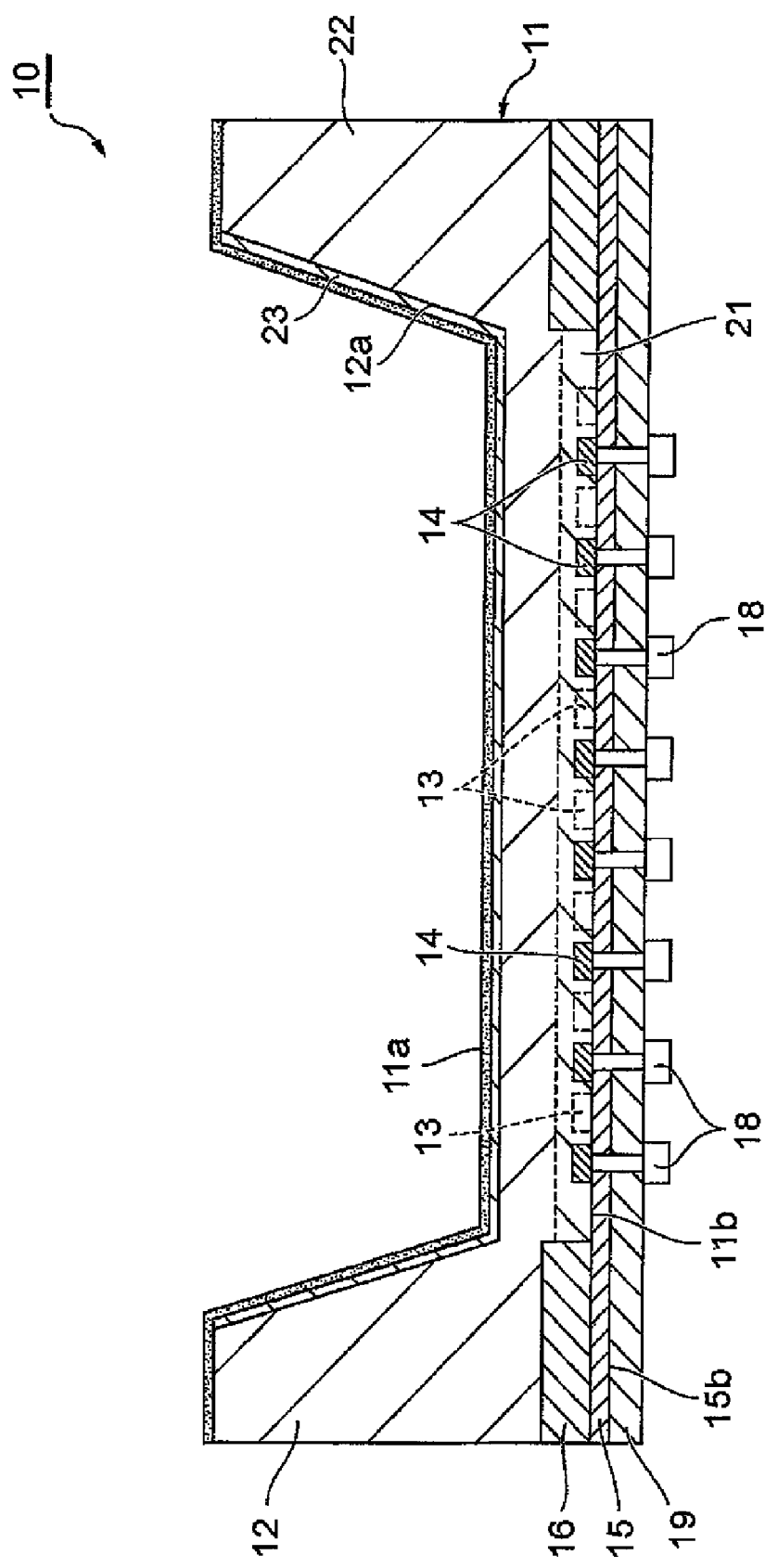
FIG. 4 is an end view along the IV-IV line of FIG. 2.

FIG. 2 is a view showing the chip of the range image sensor of FIG. 1 from the rear surface, FIG. 3 is an end view along the III-III line of FIG. 2, and FIG. 4 is an end view along the IV-IV line of FIG. 2. As shown in FIG. 2 to FIG. 4, the chip 10 includes a semiconductor substrate 11.

As shown in FIG. 3 and FIG. 4, the semiconductor substrate 11 is formed from p-type (second conductive type) Si, and has a predetermined impurity concentration. In detail, the semiconductor substrate 11 includes a p-type first semiconductor layer 21, a p$^-$ type second semiconductor layer 22, and a p$^+$ type third semiconductor layer 23, and these are laminated in this order toward the rear surface direction (upper side of FIG. 3 and FIG. 4). On this semiconductor substrate 11, light is made incident from the rear surface 11a (principal surface on the rear surface direction side). On an outer portion of the rear surface 11a of the semiconductor substrate 11, an outer frame 12 is formed which projects so as to surround the central portion. The side surface 12a inside the outer frame 12 is tapered so as to increase the thickness of the outer frame 12 and maintain the mechanical strength while maintaining the central portion thin.

On the surface 11b side of the semiconductor substrate 11, pluralities of first semiconductor regions 13 and second semiconductor regions 14 are arranged. In detail, the semiconductor regions 13 and 14 are arranged on the surface 11b side inner than the outer frame 12 of the semiconductor substrate 11 at intervals L (see FIG. 2) in contact with the surface 11b. These semiconductor regions 13 and 14 are formed from n-type (second conductive type) Si, and have a predetermined impurity concentration. Here, the semiconductor regions 13 and 14 are set as the $n^+$ type. At the interfaces between the semiconductor regions 13 and 14 and the semiconductor substrate 11, p-n junctions are formed.

As shown in FIG. 2, the semiconductor regions 13 and 14 are arranged adjacent to each other in a two-dimensional matrix form. In actuality, the semiconductor regions 13 and 14 cannot be viewed from the rear surface 11a, however, they are illustrated in FIG. 2 for description. The semiconductor regions 13 and 14 are arranged so that four first semiconductor regions 13 or second semiconductor regions 14 form a rectangle and the second semiconductor region 14 or first semiconductor region 13 comes to the position of the center point of the rectangle as viewed from the rear surface 11a. In other words, the first semiconductor regions 13 or second semiconductor regions 14 are arranged in a repetitive pattern in which the second semiconductor region 14 or the first semiconductor region 13 is disposed between the first semiconductor regions 13 or second semiconductor regions 14 adjacent to each other. Incidentally, this repetitive pattern may be a checkered pattern, stripes, or the like.

The semiconductor regions 13 and 14 have the same circular shape and the same area as viewed from the rear surface 11a (as viewed from the surface 11b of the semiconductor substrate 11). The numbers of semiconductor regions 13 and 14 arranged are equal to each other. In the range image sensor 8, four first semiconductor regions 13 and four second semiconductor regions 14 compose one pixel (inside the dashed line frame in the figure), and a plurality of pixels compose a chip 10.

Returning to FIG. 3 and FIG. 4, on the surface 11b of the semiconductor substrate 11, a first insulating layer 15 made of $SiO_2$ is laminated. On the surface 15b of the first insulating layer 15, a second insulating layer 19 made of SiN is laminated.

On the surface 11b side of the semiconductor substrate 11, an annular high-concentration layer 16 is provided so as to surround the semiconductor regions 13 and 14. To the annular high-concentration layer 16, a first electrode 24 is connected and set to have a reference potential. To the first semiconductor regions 13, second electrodes 17 are electrically connected. The second electrodes 17 connected to the first semiconductor regions 13 corresponding to one pixel are wire-connected to each other so as to have the same potential. To the first electrode 24 and the second electrodes 17, an AC power supply is connected, and between the semiconductor substrate 11 and the first semiconductor regions 13, a first reverse bias voltage is applied via the first electrode 24 and the second electrodes 17.

To the second semiconductor regions 14, third electrodes 18 are electrically connected. The third electrodes 18 connected to the second semiconductor regions 14 corresponding to one pixel are wire-connected to each other so as to have the same potential. To the third electrodes 18, the AC power supply is also connected, and a second reverse bias voltage is applied between the semiconductor substrate 11 and the second semiconductor regions 14 via the first electrode 24 and the third electrodes 18.

The first and second reverse bias voltages are modulated by the controller 4 so that a predetermined phase difference is provided between these, and the relationship of phase inversion is set here. In detail, when either the first reverse bias voltage or the second reverse bias voltage is an H bias (reaches the H bias) as a predetermined reverse bias voltage value, the other becomes an L bias with a voltage value lower than that of the H bias.

Figure 5:
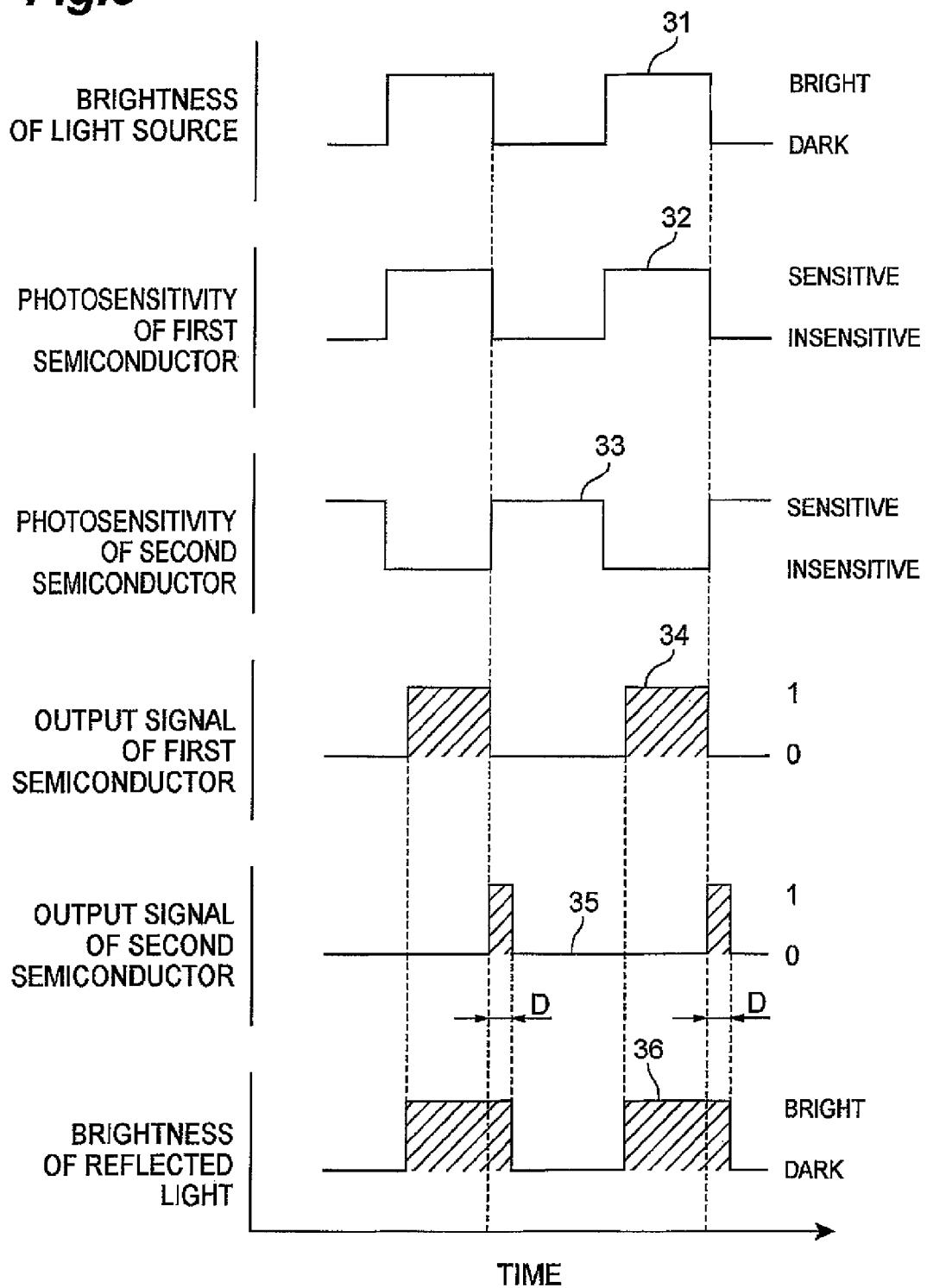
FIG. 5 is a diagrammatic drawing for describing operations of the range image sensor of FIG. 1.

In the range image measuring device 1 configured as described above, first, as shown in FIG. 5, the brightness 31 of the light source 2 is modulated with a predetermined frequency. At the same time, a first reverse bias voltage is applied between the semiconductor substrate 11 and the first semiconductor regions 13 via the first electrode 24 and the second electrodes 17 to modulate the photosensitivity 32 of the first semiconductor regions 13 in synchronization with the brightness 31 of the light source 2.

At the same time, a second reverse bias voltage is applied between the semiconductor substrate 11 and the second semiconductor regions 14 via the first electrode 24 and the third electrodes 18 to modulate the photosensitivity 33 of the second semiconductor regions 14 so as to have a phase difference π with respect to the photosensitivity 32 of the first semiconductor regions 13. In this state, light is irradiated onto a target from the light source 2, reflected light is received, and an output signal (charge) of the reflected light is detected in a time sharing manner as an output signal (charge) 34 of the first semiconductor regions 13 and an output signal (charge) 35 of the second semiconductor regions 14.

At this time, the output signal of the second semiconductor regions 14 takes the form of logical conjunction of the brightness 36 of reflected light and the photosensitivity 33 of the second semiconductor regions as shown in the figure as the phase difference (delay of phase) D between the brightness 31 of the light source 2 and the brightness 36 of the reflected light. In addition, the output signal of the first semiconductor regions 13 takes the form of logical conjunction of the brightness 36 of the reflected light and the photosensitivity 32 of the first semiconductor regions as shown in the figure as a phase difference between the brightness 31 of the light source 2 and the brightness 36 of the reflected light. Therefore, according to incidence of the reflected light, the output signal generated in the first semiconductor regions 13 or the second semiconductor regions 14 becomes as shown by the shaded portions of the figure, and therefore, by integrating the output signals output from the semiconductor regions 13 and 14 respectively by a charge amplifier, the output signal of the reflected light is obtained. Then, by calculating the ratio of these two output signals output from the semiconductor regions 13 and 14, range information (information on the distance to the target) is obtained. It is also possible that, at first obtaining a signal corresponding to the brightness 36 of reflected light by summing up the output signals from the first semiconductor regions 13 and the second semiconductor regions 14, then the ratio of the obtained signal and the output signal from the first semiconductor regions 13 or the second semiconductor regions 14 is derived to obtain range information.

For example, when the distance to the target is zero, the phase difference is also zero, so that the output signal output from the second semiconductor regions 14 is zero. On the other hand, when the modulation frequency of the light source 2 is set to 10 MHz, one period of modulation is 100 ns, and the pulse width of the portion in which the brightness 31 of the light source 2 and the brightness 36 of the reflected light are high (bright portion) is 50 ns. Light advances 30 cm per 1 ns, so that when the width of the pulse of 10 MHz is fully used, measurement is possible up to 15 m (this corresponds to the distance to the target and back, so that the one-way distance is up to 7.5 m). In other words, in this case, when light is reflected and returns from a distance of 7.5 m, the output signal output from the first semiconductor regions 13 is zero. Therefore, when reflected light is reflected and returns from the target at a distance of 0 to 7.5 m, the output signals output from the first semiconductor regions 13 and the second semiconductor regions 14 show values not zero, and a ratio of these shows range information, that is, the time of flight.

Figure 6:
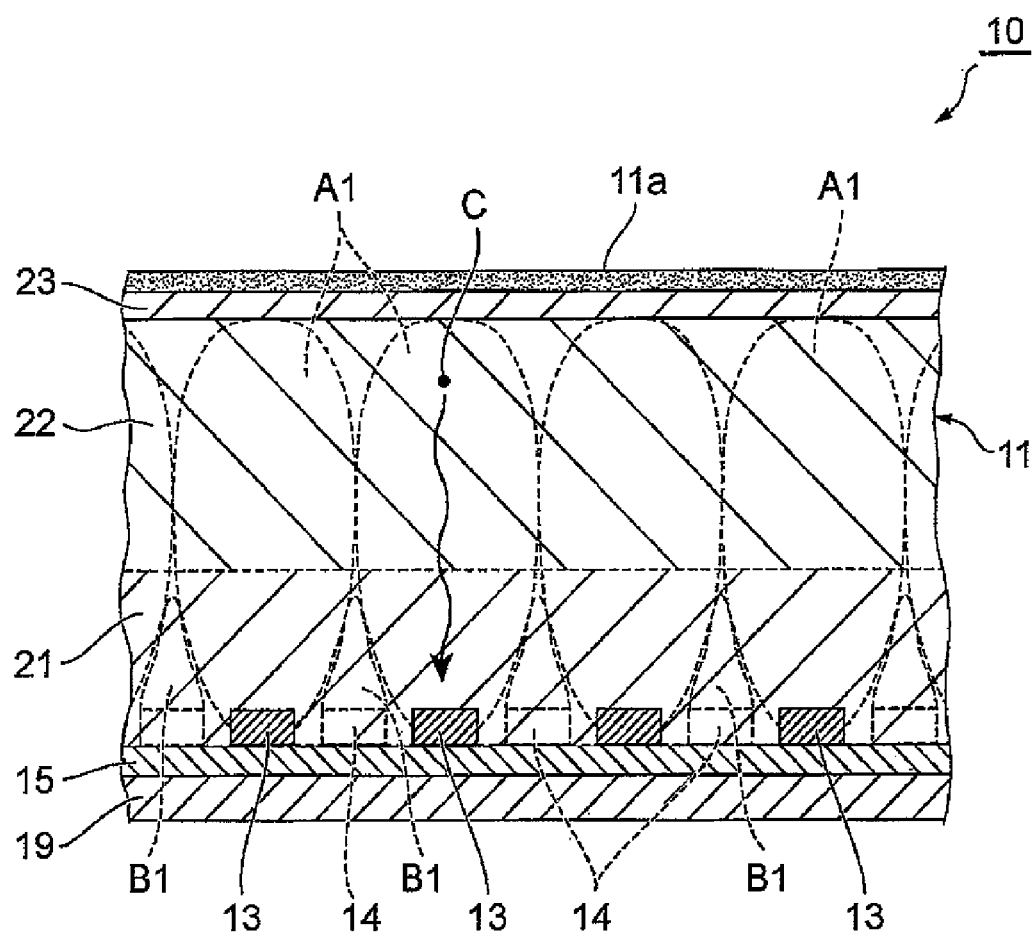
FIG. 6 is a view for describing depleted layers when the first reverse bias voltage is an H bias in the chip of the range image sensor of FIG. 1.
Figure 7:
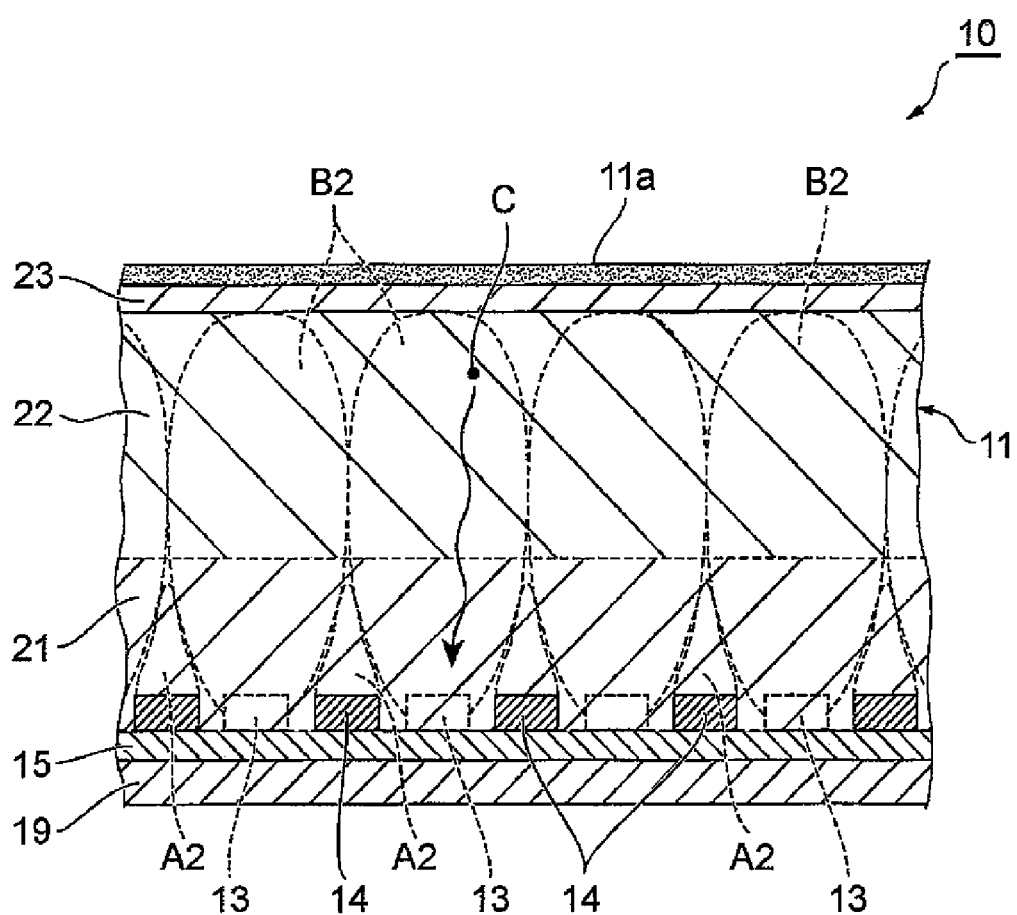
FIG. 7 is a view for describing depleted layers when the second reverse bias voltage is an H bias in the chip of the range image sensor of FIG. 1.
Figure 8:
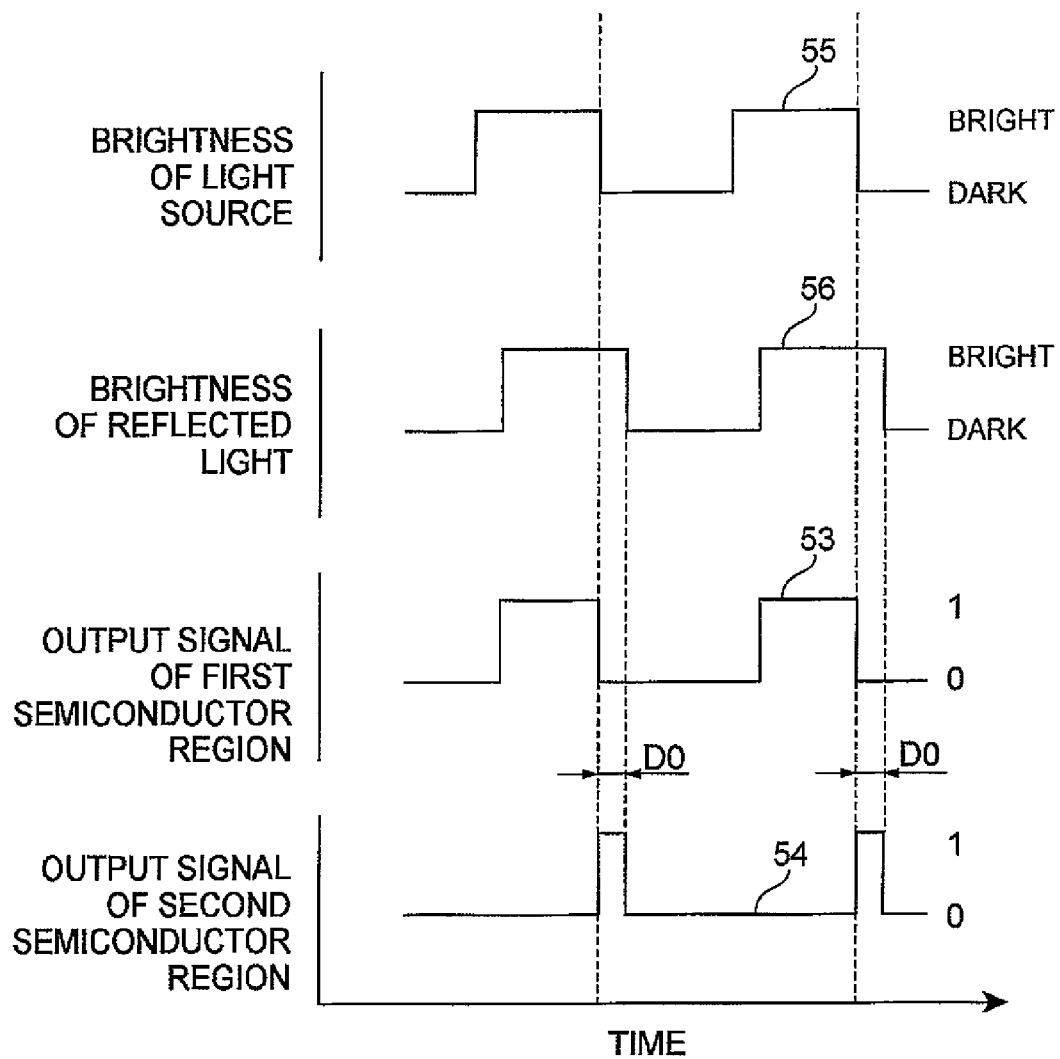
FIG. 8 is a diagrammatic drawing for describing operations of a conventional range image sensor.
Figure 9:
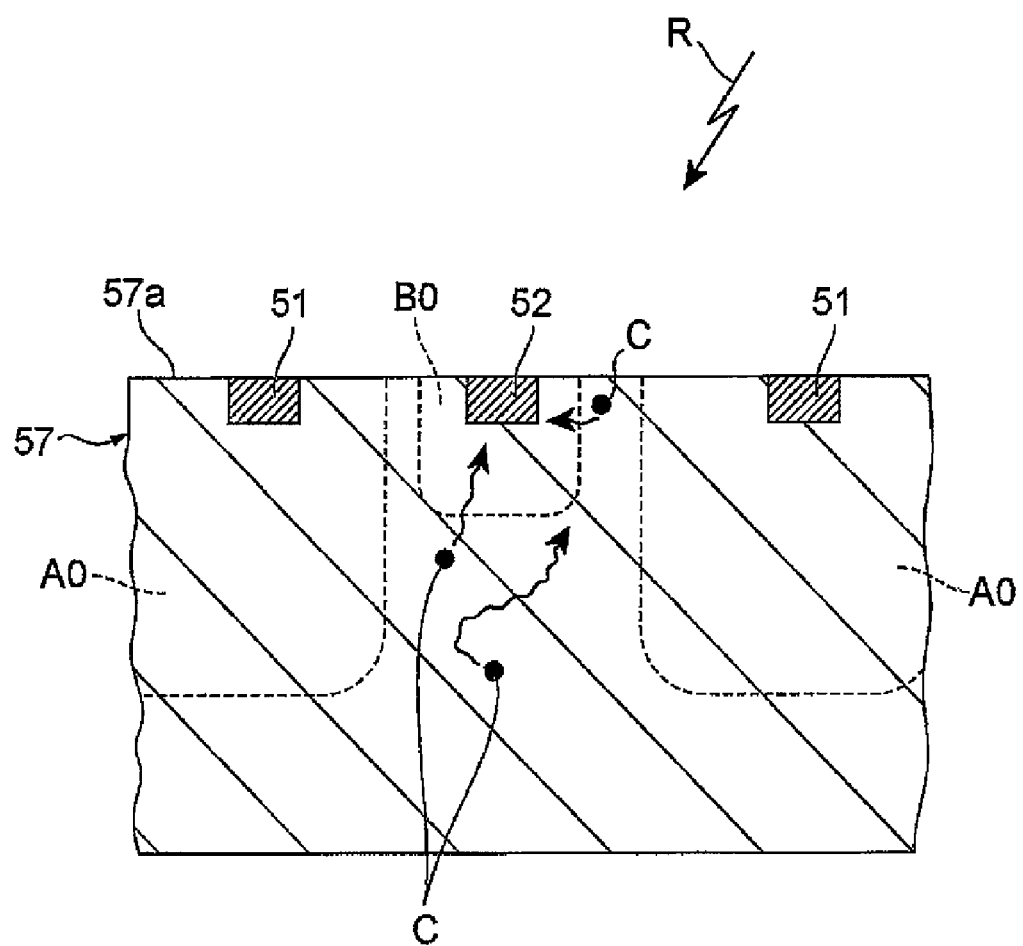
FIG. 9 is a view for describing depleted layers in the conventional range image sensor.

Here, in the present embodiment, as shown in FIG. 6, when the first reverse bias voltage is an H bias (when the second reverse bias voltage is an L bias), while the expansions of the first depleted layers A1 expanding from the p-n junctions of the first semiconductor region 13 are great, the expansions of the second depleted layers B1 expanding from the p-n junctions of the second semiconductor regions 14 are small. In this case, the first depleted layers A1 and A1 adjacent to each other overlap and link to each other, and the second depleted layer B1 positioned between these is covered by the first depleted layers A1 and A1. Therefore, on the semiconductor substrate 11, carriers C generated near the rear surface 11a can be reliably captured by the first depleted layers A1, and noise can be suppressed from being included in the output signal from the second semiconductor regions 14. Conversely, as shown in FIG. 7, when the second reverse bias voltage is an H bias (when the first reverse bias voltage is an L bias), while the expansions of the second depleted layers B2 are great, the expansions of the first depleted layers A1 are small. In this case, the second depleted layers B2 and B2 adjacent to each other overlap and link to each other, and the first depleted layer A2 positioned between these is covered by the second depleted layers B2 and B2. Therefore, carriers C can be reliably captured by the second depleted layers B2, and noise can be suppressed from being included in the output signal from the first semiconductor regions 13. As a result, the output signal of reflected light can be accurately detected in a time sharing manner as output signals of the semiconductor regions 13 and 14.

In addition, as described above, the semiconductor regions 13 and 14 are arranged on the surface 11b side of the semiconductor substrate 11, that is, the range image sensor 8 is a rear surface incident type, so that when the first or second reverse bias voltage is an H bias, substantially the entire region of the rear surface 11a side of the semiconductor substrate 11 is occupied by the first depleted layers A1 or second depleted layers B2 linking to each other. Therefore, the substantial aperture ratio can be increased. Therefore, according to the present embodiment, the time of flight since light is irradiated onto a target until reflected light is received can be accurately detected.

As described above, the semiconductor regions 13 and 14 have the same shape and the same area as viewed from the surface 11b of the semiconductor substrate 11. Accordingly, the photosensitivity of the first semiconductor regions 13 when the first reverse bias voltage is an H bias and the photosensitivity of the second semiconductor regions 14 when the second reverse bias voltage is an H bias can be reliably matched with each other. In other words, the semiconductor regions 13 and 14 can be set to the same photosensitivity characteristics. Accordingly, the output signal of the reflected light can be accurately detected as output signals of the semiconductor regions 13 and 14 in a time sharing manner. Further, as described above, the numbers of semiconductor regions 13 and 14 arranged are equal to each other, and the arrangement intervals thereof are intervals L. This also shows that the semiconductor regions 13 and 14 can be set to have the same photosensitivity characteristics.

As described above, the semiconductor regions 13 and 14 are arranged in a repetitive pattern in which the second semiconductor region 14 or first semiconductor region 13 is disposed between the first semiconductor regions 13 and 13 or second semiconductor regions 14 and 14 adjacent to each other. Accordingly, when the first reverse bias voltage or second reverse bias voltage is an H bias, the first depleted layers A1 and A1 or second depleted layers B2 and B2 adjacent to each other can be reliably and easily linked to each other.

In the present embodiment, an outer edge portion including the semiconductor regions 13 and 14 disposed on the outer periphery among those arranged on the surface 11b side of the semiconductor substrate 11 may be shielded from light on the rear surface 11a of the semiconductor substrate 11. Here, on a further outer side than the semiconductor regions 13 and 14 disposed on the outer periphery among those arranged, no other semiconductor regions except for the semiconductor substrate exist. Therefore, even depleted layers having small expansions among the depleted layers of these semiconductor regions 13 and 14 may capture carriers generated at the outer edge portion of the semiconductor substrate 11. Therefore, as described above, the outer edge portion is shielded from light, and accordingly, generation of the carriers at the outer edge portion of the semiconductor substrate 11 can be suppressed, and capturing of such carriers can be prevented.

Alternatively, in some cases, the semiconductor regions 13 and 14 disposed on the outer periphery among those arranged are set as dummy semiconductor regions which do not detect the output signal of reflected light although reverse bias voltages are applied between these and the semiconductor substrate 11. In this case, even when the depleted layers having small expansions among the depleted layers in the dummy semiconductor regions capture carriers, they do not detect the output signal, so that noise can be prevented from being mixed into the output signal.

Incidentally, in the present embodiment, as described above, when the applied first or second reverse bias voltage is an H bias, the first depleted layers A1 and A1 or the second depleted layers B2 and B2 are linked to each other. In other words, for example, the following setting is made. That is, the first semiconductor regions 13 or second semiconductor regions 14 are arranged at intervals L in a range allowing the first depleted layers A1 and A1 or second depleted layers B2 and B2 to link to each other. Further, an H bias as a predetermined reverse bias voltage in a range allowing the first depleted layers A1 and A1 or second depleted layers B2 and B2 to link to each other is applied to the first electrodes 17 or second electrodes 18 (L bias is applied to the second electrodes 18 or first electrodes 17). In addition, the semiconductor substrate 11 and the semiconductor regions 13 and 14 are formed at a predetermined impurity concentration in a range allowing the first depleted layers A1 and A1 or second depleted layers B2 and B2 to link to each other.

A preferred embodiment of the present invention is described above, however, the present invention is not limited to the above described embodiment.

For example, in the above-described embodiment, the semiconductor regions 13 and 14 are shaped to be circular as viewed from the surface 11b, however, they may be shaped into squares, rectangles, or lozenges.

In the above-described embodiment, four first semiconductor regions 13 and four second semiconductor regions 14 compose one pixel, and a plurality of pixels compose a chip 10, however, it is also possible that at least two or more first semiconductor regions and at least two or more second semiconductor regions compose one pixel or chip.

INDUSTRIAL APPLICABILITY

The present invention provides a range image sensor which can accurately detect the time of flight since light is irradiated onto a target until reflected light is received.

The invention claimed is:

1. A range image sensor comprising:
a semiconductor substrate of a first conductive type onto which light is made incident from the rear surface;
a plurality of first semiconductor regions of a second conductive type which are one-dimensionally or two-dimensionally arranged on the surface side of the semiconductor substrate and form p-n junctions with the semiconductor substrate; and
a plurality of second semiconductor regions of a second conductive type which are one-dimensionally or two-dimensionally arranged on the surface side of the semiconductor substrate, are adjacent to the first semiconductor regions, and form p-n junctions with the semiconductor substrate, wherein
to the semiconductor substrate and the first semiconductor regions, a first electrode and a second electrode for applying a first reverse bias voltage between these are electrically connected, respectively,
to the second semiconductor regions, a third electrode for applying a second reverse bias voltage having a predetermined phase difference with respect to the first reverse bias voltage between the second semiconductor regions and the first electrode electrically connected to the semiconductor substrate is electrically connected,
when the first reverse bias voltage to be applied reaches a predetermined bias voltage value, first depleted layers expanding from the p-n junctions of the first semiconductor regions adjacent to each other via the second semiconductor region are set so as to link to each other, and
when the second reverse bias voltage to be applied reaches the predetermined bias voltage value, second depleted layers expanding from the p-n junctions of the second semiconductor regions adjacent to each other via the first semiconductor region are set so as to link to each other.

2. The range image sensor according to claim 1, wherein the first semiconductor regions and the second semiconductor regions have a same shape and a same area as viewed from the surface of the semiconductor substrate.

3. The range image sensor according to claim 1, wherein the first semiconductor regions and the second semiconductor regions are arranged on the surface side of the semiconductor substrate in a predetermined repetitive pattern so that the second semiconductor region or the first semiconductor region is disposed between the first semiconductor regions or the second semiconductor regions adjacent to each other.

4. The range image sensor according to claim 1, wherein an outer edge portion including the first semiconductor regions and the second semiconductor regions disposed on the outer periphery among those arranged on the surface of the semiconductor substrate is shielded from light by the rear surface of the semiconductor substrate.

* * * * *